United States Patent [19]

Harada

[11] Patent Number: 4,605,542

[45] Date of Patent: Aug. 12, 1986

[54] PROCESS FOR PRODUCING SILICON CARBIDE WHISKER

[75] Inventor: Junzo Harada, Sodegaura, Japan

[73] Assignee: Idemitsu Kosan Company Limited, Tokyo, Japan

[21] Appl. No.: 738,746

[22] Filed: May 29, 1985

[30] Foreign Application Priority Data

Jun. 7, 1984 [JP] Japan .................................. 59-115479

[51] Int. Cl.$^4$ ............................................. C01B 31/36
[52] U.S. Cl. .................................... 423/345; 423/344
[58] Field of Search ................................. 423/344–345

[56] References Cited

U.S. PATENT DOCUMENTS 4,284,612  8/1981  Horne ................................. 423/345
4,500,504  2/1985  Yamamoto .......................... 423/345
4,521,393  6/1985  Saito .................................... 423/344

Primary Examiner—Peter D. Rosenberg
Attorney, Agent, or Firm—Frishauf, Holtz, Goodman & Woodward

[57] ABSTRACT

Disclosed is a process for producing silicon carbide whisker by mixing a silicon source with carbon black and subjecting the resultant mixture to heating treatment in an inert atmosphere, which comprises using a silica recovered from geothermal hot water as said silicon source.

The process of the present invention has the advantages of (1) being capable of producing SiC whiskers with slender diameters and small variance of lengths, and (2) contributing to effective utilization of resources by utilizing the silica recovered from geothermal hot water as the silicon source, etc. and its industrial value is great as the method for providing SiC whisker reinforcing material for various kinds of composite materials.

14 Claims, No Drawings

PROCESS FOR PRODUCING SILICON CARBIDE WHISKER

BACKGROUND OF THE INVENTION

This invention relates to a process for producing silicon carbide (SiC) whiskers, more particularly to a process for producing SiC whiskers which are slender and regularly shaped by use of a novel silicon source.

SiC whisker is excellent in characteristics such as specific strength, specific modulus, heat resistance, chemical stability, etc. and its usefulness as a composite reinforcing material for plastics is attracting attention.

As the process for producing SiC whisker, there have hitherto been developed various processes. For example, a process in which husks ash is employed as the silicon source and granulated carbon black as the carbon material (see Japanese Unexamined Patent Publilcation No. 45198/1983); a process in which it is produced from various kinds of silicon sources and carbon materials in the presence of an alkali metal halide (see Japanese Unexamined Patent Publication No. 125697/1983); a process in which it is produced from a silica gel containing water-soluble compounds of iron, nickel and cobalt, and furnace carbon black (see Japanese Unexamined Patent Publication No. 145700/1983); and a process in which cullet which is crushed waste glass is used as the silicon source and furnace carbon black as the carbon material (see Japanese Unexamined Patent Publication No. 172297/1983).

However, up to date, no process for production of SiC whisker has been known, in which the silica recovered from geothermal hot water is employed as the silicon source.

SUMMARY OF THE INVENTION

An object of the present invention is to provide a process for producing SiC whisker which is novel in the silicon source which is utilized.

The present inventor has examined various materials as the silicon source for SiC whisker and found that the SiC whiskers produced from the silica recovered from geothermal hot water and carbon black are slenderer in diameter and more regularly shaped as a whole as compared with those produced from other silicon sources such as quartz, anhydrous silicic acid, etc. and carbon black, to accomplish the present invention.

More specifically, the process for producing the SiC whisker of the present invention is a process for producing a silicon carbide whisker by mixing a silicon source with carbon black and subjecting the resultant mixture to a heating treatment in an inert atmosphere, which comprises using a silica recovered from geothermal hot water as said silicon source.

DESCRIPTION OF PREFERRED EMBODIMENTS

The silicon source in the present invention is the silica recovered from geothermal hot water. The recovered silica can be obtained as follows. That is, geothermal hot water of having a temperature of 200° C. at the bowels of the earth and having a temperature of 80° to 100° C. when taken from the earth, is left to stand stationary at room temperature. It is preferred to use geothermal hot water having a silica content of 200 to 1000 ppm. The time for stationary standing may be about one week. Silica particles exist in the colloidal state. Then, the colloidal solution is subjected to ultrafiltration to concentrate the solid to about 20%, and the concentrate is dried by, for example, spray drying to simultaneously dry and form a powder silica. The particle size and the water content of the recovered silica depend on the conditions employed in these treatments, but it is generally preferred to obtain a particle size to 1 of 50 $\mu$m and a water content of 1 to 50 wt. %, preferably 10 to 20 $\mu$m and 4 to 20 wt. %, respectively, in the process of the present invention.

The recovered silica obtained by such a process is mixed with carbon black. Carbon black as the carbon material is not particularly limited, but various carbon blacks such as furnace black, acetylene black, lamp black, etc. may be used as desired. Among them, acetylene black is preferred. Also, the mixing ratio of the recovered silica to carbon black is not particularly limited, but it is generally preferred to employ equal amounts in terms of volume ratio.

Next, the powdery mixture is subjected to heat treatment. This heat treatment is conducted in an inert gas atmosphere such as argon, helium and others, and its temperature may be generally 1300° to 1800° C. and the treatment time 1 to 4 hours, preferably 1400° to 1600° C. and 2 to 3 hours, respectively. In this procedure, the silicon component and the carbon component in the powdery mixture undergo a gas phase reaction to form minute fibrous SiC whiskers. The heating means may preferably be an electric furnace for relatively easier management of the treating conditions.

After cooling, the reaction product is taken from the furnace. All of the reaction product mixture are not SiC whiskers, but a part is a mixture of carbon black and SiC whiskers. Accordingly, the reaction product is calcined at a temperature at which SiC will not be pyrolyzed in an oxidizing atmosphere such as air, thereby removing carbon black by burning. The calcination temperature may be 500° to 800° C., preferably 650° to 750° C.

Thus, only the desired SiC wiskers can be obtained.

EXAMPLE

Geothermal water of about 100° C. and having a silica content of 500 ppm taken from a geothermal well was left to stand at room temperature for one week. The colloidal solution was filtered through an ultrafiltration membrane (trade name: Labomodule, produced by Asahi Kasei Kogyo K.K.) and silica components were recovered by spray drying. The silica recovered was found to have a primary particle size of 100 to 200 Å, with a composition of $SiO_2$ 96%, $Al_2O_3$ 0.5%, $Fe_2O_3$ 1.5%, $Na_2O$ 1% and CaO 1%.

The recovered silica and acetylene black (trade name: Denka Black, produced by Denki Kagaku Kogyo K.K.) were mixed in equal volumes, and the resultant powder mixture was filled in a vessel made of graphite equipped with a lid (60 mm in diameter, 70 mm in height). The vessel was set in Keramax furcace and heated at 1600° C. for 4 hours under an argon stream of 1 liter/min.

After the heat treatment, the contents of the vessel were transferred into a porcelain dish and heated in air at 700° C. for 2 hours. Unaltered acetylene black was removed by calcination to give pale greenish white whiskers.

The whisker was subjected to powder X-ray diffraction analysis to confirm that it was $\beta$-type SiC whisker. The diameter and length of the whisker was measured to find that the diameter was 0.5 μm and the length 200 μm on average, respectively.

Purity 90%, and yield 90% based on the recovered silica.

For comparative purpose, the same process as described above was repeated except for using quartz powder with an average particle size of 5 μm and anhydrous silicic acid powder as the silicon source. In each case, SiC whiskers were obtained, but the average diameters were 1-2 μm and 2 μm, respectively, with the lengths being 20 μm, 30 μm, respectively, and irregular. Besides, a large amount of a mass of granules were formed.

As is apparent from the above description, the process of the present invention has the advantages of (1) being capable of producing SiC whiskers with slender diameters and small variance of lengths, and (2) contributing to effective utilization of resources by utilizing the silica recovered from geothermal hot water as the silicon source, etc. and its industrial value is great as the method for providing a SiC whisker reinforcing material for various kinds of composite materials.

I claim:

1. The process for producing silicon carbide whiskers comprising mixing a silicon source with carbon black to form a reaction mixture and heating said reaction mixture in an inert atmosphere to form silicon carbide whiskers, said silicon source being silica recovered from geothermal hot water having a silica content of from 200 to 1000 ppm.

2. The process of claim 1, wherein said recovered silica has a particle size of from 1 to 50 μm and a water content of from 1 to 50 wt. %.

3. The process of claim 1, wherein said recovered silica has a particle size of from 10 to 20 μm and a water content of 4 to 20 wt. %.

4. The process of claim 1, wherein said carbon black is selected from the group consisting of furnace black, acetylene black and lamp black.

5. The process of claim 1, wherein said carbon black is acetylene black.

6. The process of claim 1, wherein the ratio of recovered silica which is utilized as said silicon source to carbon black is the volume ratio of about 1:1.

7. The process of claim 1, wherein said inert atmosphere is argon or helium.

8. The process of claim 1, wherein said heating is at a temperature of from 1300° to 1800° C. for a time of from 1 to 4 hours.

9. The process of claim 1, wherein said heating is at a temperature of from 1400° to 1600° C. for a time of from 2 to 3 hours.

10. The process of claim 1, wherein said reaction mixture is heated in an electric furnace.

11. The process of claim 3, wherein said inert atmosphere is argon or helium and said heating is at a temperature of from 1300° to 1800° C. for a time of from 1 to 4 hours.

12. The process of claim 11, wherein said carbon black is selected from the group consisting of furnace black, acetylene black and lamp black and the mixture ratio of the recovered silica to carbon black is equal amounts in terms of volume ratio.

13. The process of claim 12, wherein said recovered silica has a particle size of from 10 to 20 μm and a water content of 4 to 20 wt. % and the heat treatment is conducted at a temperature of 1400° to 1600° C. for a treatment time of 2 to 3 hours.

14. The process for producing silicon carbide whisker according to claim 12, wherein said carbon black is acetylene black.

* * * * *